US008264256B2

(12) United States Patent
Logiudice et al.

(10) Patent No.: US 8,264,256 B2
(45) Date of Patent: Sep. 11, 2012

(54) DRIVER AND METHOD FOR DRIVING A DEVICE

(75) Inventors: Andrea Logiudice, Padua (IT); Michael Lenz, Zorneding (DE)

(73) Assignee: Infineon Technologies Austria AG, Villach (AT)

( * ) Notice: Subject to any disclaimer, the term of this patent is extended or adjusted under 35 U.S.C. 154(b) by 763 days.

(21) Appl. No.: 12/252,122

(22) Filed: Oct. 15, 2008

(65) Prior Publication Data

US 2010/0090728 A1    Apr. 15, 2010

(51) Int. Cl.
*H03K 3/00* (2006.01)
(52) U.S. Cl. .......................... 327/108; 361/78
(58) Field of Classification Search ............... 361/78
See application file for complete search history.

(56) References Cited

U.S. PATENT DOCUMENTS

| 4,721,869 | A | 1/1988 | Okado |
| 6,016,044 | A * | 1/2000 | Holdaway ............ 318/696 |
| 7,804,470 | B2 * | 9/2010 | Poon ............ 345/87 |
| 2002/0008490 | A1 * | 1/2002 | Holdaway ............ 318/696 |

FOREIGN PATENT DOCUMENTS

| DE | 36 89 445 T2 | 7/1994 |
| DE | 197 04 861 A1 | 8/1998 |
| DE | 102 09 021 A1 | 10/2003 |

* cited by examiner

*Primary Examiner* — Stephen W Jackson
*Assistant Examiner* — Angela Brooks
(74) *Attorney, Agent, or Firm* — Slater & Matsil, L.L.P.

(57) ABSTRACT

Embodiments of the invention relate to drivers and methods for driving devices, comprising at least one functional unit at least one of which is adapted to deduce a device parameter of an electronic device from a terminal parameter of the electronic device.

24 Claims, 2 Drawing Sheets

DRIVER AND METHOD FOR DRIVING A DEVICE

TECHNICAL FIELD

The present invention relates generally to drivers, driver circuits and methods for driving devices. Embodiments of the invention relate to drivers for at least one device (e.g., a semiconductor switch) which merely use one or more terminal parameters of the device for adapting a driving signal for the device.

BACKGROUND

A driving circuit for protecting a driven switching device, e.g., a MOSFET switch, and the switching device can be integrated into a single protected MOSFET device. Such protected MOSFET devices generally comprise a control-chip as a driver for providing the driving and protection functionality. Moreover, the protected MOSFET devices typically comprise a base-chip in a correspondingly low ohmic power semiconductor technology for implementing the actual MOSFET switching device. To provide the protection functionality, conventionally a temperature sensor element and a current sensor element are integrated into the base-chip to directly sense reliability relevant device parameters like the base-chip device temperature or device parameters from which other reliability relevant devices parameters (e.g., the power dissipated in the base-chip) may be calculated such as the drain current of the MOSFET switching device.

In this context, the directly sensed reliability relevant parameters or device parameters represent feedback parameters from the base-chip to the control-chip such that the control-chip may adapt the driving signal to protect the base-chip. In the example of a MOSFET switching device as base-chip, the control-chip may generate a gate source voltage as the driving signal for the MOSFET switching device within the base-chip which ensures a safe operation of the base-chip.

To provide the above-mentioned different functionalities, the control-chip as driver and the base-chip as driven device are often fabricated in different types of semiconductor technologies and then assembled into a single device package.

Moreover, according to other conventional solutions, the circuits of the control-chip and base-chip may also be monolithically integrated on a single semiconductor substrate using a so-called smart power semiconductor technology. In this way, for instance, the driving and protection circuit providing the signal conditioning functionality and, e.g., an N-substrate vertical Double-diffused Metal-oxide Semiconductor Field Effect Transistor (DMOSFET) providing the power switching functionality may be integrated on the same chip.

The integration into a single package or even onto the same semiconductor substrate provides advantages in terms of a lower complexity of the system comprising the control-chip and the base-chip functionality on an application level. However, these conventional approaches all bear disadvantages in terms of increased costs or reduced reliability.

For instance, approaches to integrate the control-chip as driver and the base-chip as driven device into a single package result in a complex chip assembly. An example for such a complex chip assembly may be seen in FIG. 1 using the so-called chip by chip technology. The chip by chip or the chip on chip technology, which may be used alternatively, not only lead to a complex chip assembly but also to reliability issues. For instance, reliability problems may arise because of the critical chip to chip interconnections, in the example of FIG. 1 the chip to chip bond wires, or due to thermal issues or mechanical stress.

Furthermore, the complex chip assemblies lead to higher packaging costs since special glues, special lead-frames and/or special wafer-back processing may be required to implement the chip assemblies.

Moreover, a further disadvantage results from the fact that the semiconductor technology which is conventionally used for the driven device, here the base-chip, may not be the cheapest and/or the most suitable one. The reason for this is that temperature and current sense structures have to be implemented within this device for providing the above-mentioned feedback signal to the driver, here the control-chip, for protection reasons.

Furthermore, if several devices, in the example MOSFET devices, are to be driven, a redundancy results in the drivers, here the control-chips, since 50% of the area of the control-chips are normally used for so called central functions that could be shared when driving a plurality of MOSFET devices.

A conventional approach for monolithically integrating the above-mentioned functionalities of the control-chip (driver) and the base-chip (driven device) may suffer from high wafer costs. One reason for this may be the additional mask-steps for the temperature and current sense structures which need to be implemented in the base-chip part of the monolithically integrated device.

For these or other reasons, there is a need for the present invention.

SUMMARY OF THE INVENTION

A first embodiment of the invention provides a driver for an electronic device. The driver includes at least one functional unit that is adapted to deduce a device parameter of the electronic device from a terminal parameter of the electronic device.

Further features and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION OF ILLUSTRATIVE EMBODIMENTS

In the following Detailed Description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

In the following, for illustration purposes, the invention will be described with reference to a driving circuit for protecting a driven switching device, for instance, a Metal-Oxide Semiconductor Field Effect Transistor (MOSFET) commonly used as a power switch in various fields and in particular in automotive and industrial applications. However, the invention is not so limited and may find its application in conjunction with any other type of driver and driven device wherein an improved feedback path between driver and driven device may provide various advantages.

Typically, the invention may help to integrate driver and driven device on a single substrate or to increase the performance or reliability of the driven device by a simplified but yet more efficiently used feedback between driver and driven device.

Figure 1:
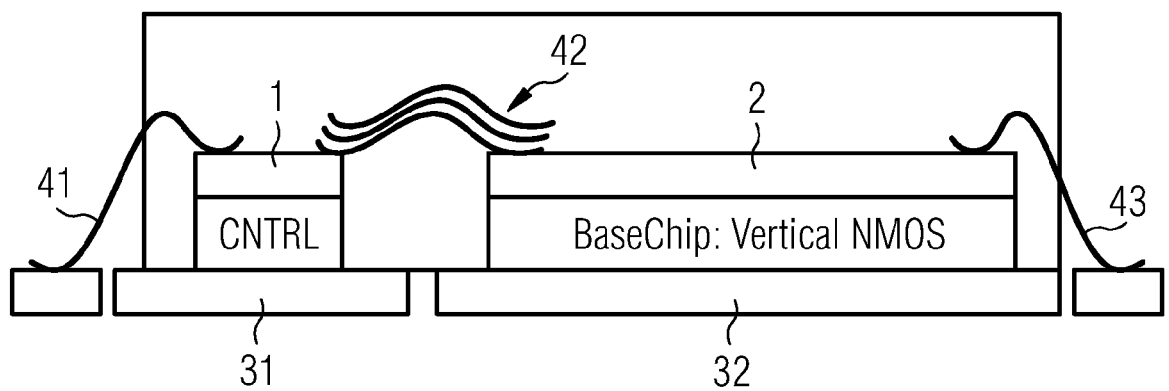
FIG. 1 shows an example of a conventional driver in the form of a control-chip and a driven device in the form of a vertical n-channel MOSFET as base-chip.

FIG. 1 shows an example of a conventional driver in the form of a control-chip 1 and a driven device in the form of a base-chip 2 implemented in the above-mentioned chip by chip topology for their integration into a single device package (not shown). As indicated in FIG. 1 by a different shading, the control-chip 1, in practice also referred to as top-chip, is typically fabricated in a Bipolar CMOS DMOS (BCD) technology, (Complementary Metal-Oxide Semiconductor, Double-diffused Metal-oxide Semiconductor). The base-chip 2, however, is fabricated in a vertical n-channel Metal-Oxide Semiconductor (NMOS) technology which is better suited to handle larger powers.

The corresponding vertical MOSFETs in the base-chip exhibit a different structure than lateral MOSFETs. As with a large number of power devices, their structure is vertical and not planar. In a MOSFET device with a planar structure, the current and breakdown voltage characteristics of the device are both functions of the channel dimensions of the device, i.e., width and length of the channel. This results in an relatively inefficient use of chip/silicon area with regard to high power applications. In a MOSFET device with a vertical structure, the voltage rating of the device is a function of the doping and thickness of a central epitaxial layer, whereas the current rating is a function of the channel width. This enables a vertical MOSFET device to sustain both high blocking voltages and high currents within a compact piece of silicon and thus results in a more efficient use of chip/silicon area with regard to high power applications.

Since the drains of the vertical n-channel MOSFET devices inside the base-chip 2 are contacted through the backside of the base-chip 2, the lead-frame 31 of the control-chip 1 has to be separated from the lead-frame 32 of the base-chip 2 to electrically isolate the substrate of the control-chip 1 from the drains of the base-chip 2. These separated lead-frames 31, 32 contribute to the above-mentioned complex chip assembly when the control-chip 1 and the base-chip 2 are to be integrated into a single device package.

Also alternative solutions for isolating the backsides of the control-chip 1 and the base-chip 2 such as using isolating glue for the control-chip 1 or using a chip on chip architecture increase the complexity of the chip assembly or suffer from problems related to the increased thickness of the chip stack.

Moreover, the complexity of the chip by chip assembly in the example of FIG. 1 is further increased by the additional bond wires 42 which are necessary to interconnect the control-chip 1 and the base-chip 2 beyond the bond wires 41, 43 to connect the control-chip 1 and the base-chip 2 with external pins.

Conventional approaches to integrate the functionality of a driver (e.g., the driving and protection functionality of the control-chip 1)—and the functionality of a driven device (e.g., power switching functionality implemented in the base-chip 2) into a single device package use the chip on chip, chip by chip technology or monolithically integrated chips using smart power semiconductor technologies. Examples for these technologies are High Integration FETs (HITFETs®), Protected FETs (PROFETs®), Smart Power Technology (SPT™) or SMART all by Infineon Technologies.

Embodiments of the invention relate to a driver for an electronic device such as a semiconductor switch. Such embodiments may use a different architecture compared to the above control-chip/base-chip architecture wherein a single driver or driver-chip may more easily control a plurality of electronic devices or base-chips. The architecture may differ in that the feedback from the driven devices to the driver, e.g., to protect these electronic devices, is simplified. More specific embodiments relate to a driver for electronic devices, in particular semiconductor switches, which also provides a protective and/or a diagnostic functionality with respect to the driven device.

For that purpose, in the above embodiment the driver may comprise at least one functional unit which is adapted to deduce a device parameter of the electronic device as feedback parameter for the driver from a terminal parameter of the electronic device. For instance, the functional unit may comprise a memory, in particular a look-up table, which enables the driver to deduce device parameters which may be stored in the memory. For example, the driver may deduce the drain current of a MOSFET device stored in the memory from a determined terminal parameter of the MOSFET device such as one of its terminal voltages.

Hence, in general, the memory (e.g., the look-up table) may contain information to drive a device connected to the driver. In the case of a MOSFET device as a driven device, the look-up table may, e.g., store the drain current as a function of the gate to source voltage Vgs, the drain to source voltage Vds and the temperature Temp1 of the corresponding MOSFET device Id=f(Vgs, Vds, Temp1).

In a more specific embodiment of the driver, at least one functional unit may be adapted to determine the terminal parameter of the electronic device used to deduce a device parameter. An example for such a functional unit may be an analog-to-digital converter (ADC) which may be adapted to determine and quantify at least one terminal voltage of a MOSFET device as the terminal parameter of an electronic device.

Hence in a specific embodiment, one control-chip as driver is controlling one or more MOSFET devices as driven devices. In this embodiment, the feedback from the MOSFET devices to the control-chip is simplified in that it is not necessary to directly sense the current or the temperature of the MOSFET devices as device and feedback parameters such that the control-chip may adapt the driving voltages to protect the MOSFET devices. In fact, merely terminal parameters such as terminal voltages of the MOSFET devices may be used as feedback parameters.

In other words, the sensing functionality of device parameters, e.g., reliability relevant device parameters, may be shifted to the control-chip in the form of deducing these parameters from the terminal voltages of the driven devices. Hence, for instance the driven MOSFET devices do not need the corresponding sense structures, and, consequently, more appropriate semiconductor technologies may be used to implement the MOSFET devices.

Hence, embodiments of the invention may enable lower cost technologies that can be used for fabricating the MOSFET devices since, e.g., no current sense or temperature sensors are necessary. Additionally, users may purchase the correspondingly simpler MOSFET devices from different suppliers and more economically priced. This increased flexibility may help with respect to supply availability and may lead to a reduction of storage and production costs. Moreover, embodiments of the invention enable control-chip and base-chip functionalities that do not necessarily require the use of different semiconductor technologies. Thus, the functionalities can be more easily monolithically integrated into a single device, in particular when smart power semiconductor technologies are used. Hence, no extra bonding is necessary to interconnect separate control-chips with separate base-chips. Furthermore, in case the control-chip and base-chip functionalities may be integrated into a single device, there is no need for special packages. The corresponding monolithically integrated combination of driver and driven circuit, such as a protected MOSFET device, may also be used without a package in certain applications.

In particular, the driver may make use of or comprise a memory that may contain a plurality of characteristics related to the driven devices, e.g., device parameters of the driven MOSFET devices. Thus, these device parameters need not be sensed directly but may be deduced merely from one or a combination of terminal parameters of the driven devices or may be used for the calculation of further device parameters of the driven MOSFET devices.

In further embodiments of the driver, at least one functional unit of the driver may be adapted to process at least one terminal parameter of the driven electronic device to calculate at least one device parameter. Moreover, the at least one functional unit of the driver may be adapted to process deduced device parameters with sensed terminal parameters of the driven electronic device to determine calculated device parameters.

Hence in embodiments, the driver may make use of the computational power based on new sub micron technologies which may be embedded in the above-mentioned smart power technologies such as Infineon's SPT9™ technology. For that purpose, specific embodiments of the driver may further comprise a digital signal processor (DSP) that may, for example, calculate the required driving voltage or driving current based on a variety of determined device information. Such determined device information may comprise a measured drain to source voltage of a MOSFET device as a terminal and feedback parameter for the driver, stored MOSFET device parameters such as the thermal impedance Zth of the MOSFET device, further device parameters resulting from a specific assembly of a MOSFET device within a specific package, on a specific printed circuit board (PCB), in a specific shelter or due to further construction data, the deduced drain current, the calculated temperature, power etc.

In certain embodiments of the driver, at least one functional unit of the driver is adapted to generate a driving signal (e.g., a driving voltage or driving current) for the electronic device in dependence of a deduced or calculated device parameter for protecting the electronic device. In this context, protecting the electronic device may comprise adapting the driving signal such that predetermined temperatures, voltages, currents or other device parameters do not exceed predetermined limits which may be stored in the look-up table or other memory of the driver.

Embodiments of the driver may be adapted to drive at least one semiconductor switch which is comprised in the group of MOSFET switches, bipolar transistor switches, IGBT switches or the like.

In further embodiments of the driver, at least one functional unit (e.g., a power driver stage) of the driver may be adapted to provide the required voltage and current to a control terminal of the electronic device (e.g., an electronic switch).

Moreover, embodiments of the invention relate to a driver circuit for at least one switching device, wherein the driver circuit is configured to determine at least one device parameter of the switching device as determined device information for adapting a driving signal for the switching device.

In certain embodiments, the driver circuit may be configured to generate the driving signal, e.g., a gate to source voltage for a MOSFET switching device, in dependence of at least one piece of the determined device information to protect the switching device. Embodiments of the driver circuit may comprise a unit, e.g., an analog sensor or an ADC, to determine and/or quantify at least one terminal parameter of the switching device as the determined device information.

Further embodiments of the driver circuit may comprise a look-up table as a storage unit. In such a look-up table, pairs or generally n-dimensional arrays may be stored. The content of these arrays in the look-up table may represent and relate terminal parameters with further device parameters of a driven switching device which physically belong together and hence represent a specific operating point of the driven device. Correspondingly, based on the arrays in the look-up table at least one device parameter of the switching device may be deduced as the above mentioned determined device information in dependence of at least one terminal parameter.

An embodiment of the driver circuit may comprise a processor, e.g., a DSP, to calculate at least one reliability relevant device parameter of the switching device as the determined device information based on at least one terminal parameter and/or at least one deduced device parameter.

In embodiments of the driver circuit, the at least one reliability relevant device parameter of the switching device may be comprised in the group of instant power dissipation of the switching device, a predetermined instant temperature, current or voltage of the switching device as well as a moving peak power dissipation of the switching device, a predetermined moving peak temperature, current or voltage of the switching device or the like.

In a further embodiment of the driver circuit, the processor may be further adapted to monitor and/or count at least one reliability relevant event of the switching device as the determined device information. In alternative embodiments, the processor may be adapted to monitor and/or count any type of predetermined event of the switching device such as a certain device parameter exceeding, taking or falling below a predetermined value. Hence, embodiments of the invention enable history tracking for a specific device.

In embodiments of the driver circuit, the at least one reliability relevant event of the switching device is comprised in the group of short circuit events, excess temperature operation events, excess current operation events, excess voltage operation events, inductive clamping events or the like.

Embodiments of the driver circuit may comprise a memory (e.g., a non-volatile memory) as storage unit to store at least one piece of determined device information and/or device characteristic information, for instance the thermal impedance of the driven device.

In embodiments of the driver circuit, the processor further may implement a protection algorithm for the generation of a driving signal suited to protect the switching device, wherein the protection algorithm is comprised in the group of generation and consideration of de-rating factors for the switching device, monitoring of a safe operation area (SOA) of the switching device or the like. Hence, the processor, e.g., a DSP, may provide the required mathematical operations needed to implement the protective driving functionality.

For (power) semiconductor devices such as bipolar junction transistors (BJTs), MOSFETs, thyristors or IGBTs, a SOA may be defined as the voltage and current conditions over which the semiconductor device may be expected to operate without self-damage.

For a MOSFET device, a SOA may be given in the datasheet of the MOSFET device as a graph with drain source voltage on the abscissa and drain current on the ordinate. The safe operation "area" refers to the area under this graph. Such SOA specifications may combine various limitations of the device such as maximum voltage, current, power, pulse duration, duty cycle, energy, junction temperature or secondary breakdown voltage into a single graph. Such a graph may easily be stored in a storage unit, i.e., the look-up table or the different memory of the driver according to an embodiment of the invention. In addition to a graph for a continuous rating case, separate SOA graphs may be stored for short duration conditions such as 1 ms pulses, 10 ms pulses etc.

In embodiments of the driver circuit, the processor may be further adapted to monitor at least one determined device information, e.g., the drain current Id, the drain to source voltage Vds, the gate to source voltage Vgs, the temperature Temp, the power dissipation, etc. in the case of a MOSFET as the driven device, is inside a SOA which may be stored in the storage unit.

Furthermore, the above-mentioned de-rating factors may be determined by using the history tracking functionality for a specific device, e.g., by considering information related to reliability relevant events in the history of the specific device which may be stored in a non volatile memory.

Moreover, embodiments of the invention relate to a system comprising embodiments of the above-described driver circuit and a switching device, wherein the driver circuit and the switching device are monolithically integrated and fabricated in a smart power semiconductor technology with an embedded microprocessor.

Furthermore, embodiments of the invention relate to an adaptable driver for at least one device using feedback and configured to merely use one or more terminal parameters of the device as feedback parameters or feedback signal for adapting a driving signal for the device. Hence, embodiments of this driver for driving a MOSFET device do not need a current or temperature signal as feedback parameter from the driven MOSFET device.

Moreover, embodiments of the invention relate to a driver means for driving at least one device, wherein the driver means is adapted to determine at least one terminal parameter of the device for generating a driving signal for the device such that the device is protected from reliability relevant events.

Further embodiments of the invention relate to a method for driving at least one device. The method comprises determining at least one terminal parameter of the at least one device. Furthermore the method comprises generating at least one driving signal for the at least one device in dependence on the at least one terminal parameter.

In embodiments, the method may further comprise deducing at least one device parameter of the at least one device from the at least one terminal parameter. Further embodiments of the method may comprise calculating at least one reliability relevant device parameter.

In further embodiments, the method may comprise monitoring at least one reliability relevant event of the at least one device. Moreover, embodiments of the method may comprise tracking the number and/or at least one reliability relevant device parameter of at least one reliability relevant event.

In certain embodiments, the method may further comprise performing a protection algorithm for generating the at least one driving signal, wherein the protection algorithm is comprised in the group of generation and consideration of de-rating factors for the device, monitoring of a SOA of the device in the generation process for the at least one driving signal or the like.

Figure 2:
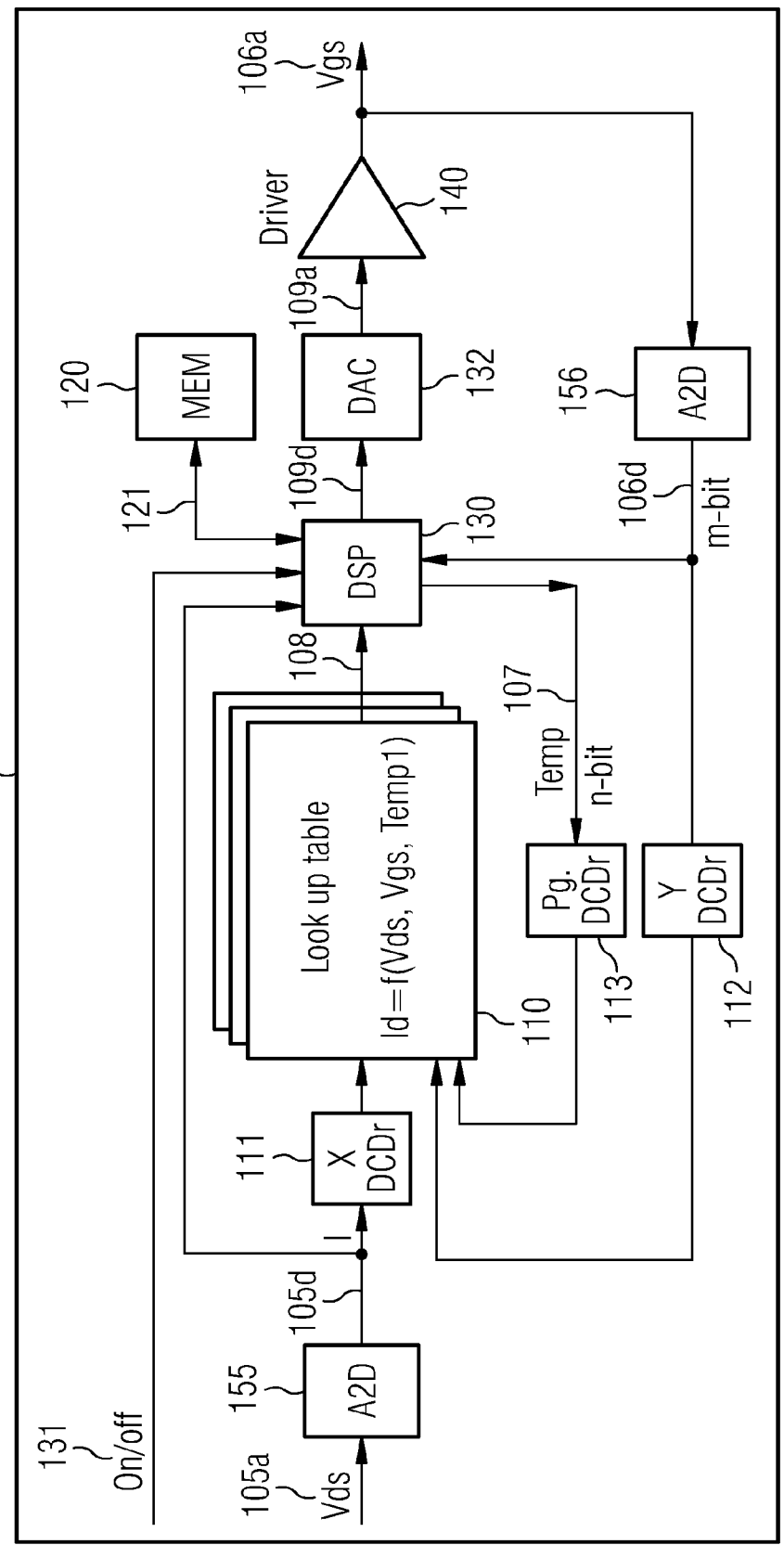
FIG. 2 shows an embodiment of a driver according to the invention.

Now with respect to FIG. 2, a schematic block diagram is shown representing a driver circuit 100 according to a specific embodiment of the invention for driving one or more MOSFET devices (not shown). The major building blocks of the driver circuit 100 as control-chip for one or more MOSFET devices as base-chips are a look-up table 110, a DSP 130, ADCs 155, 156, a memory 120 and a power driver stage 140.

As depicted in FIG. 2, in order to determine and quantify the terminal voltages (Vds, Vgs) of a driven MOSFET device as the terminal parameters for deducing "internal" device parameters of the corresponding MOSFET device, the driver circuit 100 may comprise two functional units, namely the ADCs 155, 156. Specifically, the ADC 155 may receive the analog drain to source voltage signal 105a of a specific MOSFET device and may convert it into a corresponding digital drain to source voltage signal 105d for further processing by the driver circuit 100.

Furthermore, the ADC 156 may receive the analog gate to source voltage signal 106a of the specific MOSFET device and may convert it into a corresponding digital gate to source voltage signal 106d for further processing by the driver circuit 100. In the embodiment as shown in FIG. 2, the ADCs 155, 156 may convert the analog terminal voltage signals of MOSFET devices into digital words of n-bits. The address decoders 111, 112 may use these digital words of n-bits to generate the corresponding memory address within the look-up table 110 which may contain the corresponding digital drain current value at a given temperature Temp 1 of the MOSFET device.

As shown in FIG. 2, the driver circuit 100 may comprise a functional unit, namely the look-up table 110, which is adapted to deduce device parameters of a MOSFET device from its terminal parameters such as its drain to source voltage Vds and/or its gate to source voltage Vgs. For instance, the drain current Id of the MOSFET device may be deduced as device parameter which may serve as feedback parameter for the driver circuit 100 to generate an adapted gate to source voltage Vgs for the MOSFET device.

For the generation of an adapted gate to source voltage Vgs for the MOSFET device, the look-up table 110 may provide deduced digital MOSFET parameters to the DSP 130.

The look-up table 110 may be implemented with a non-volatile memory (e.g., flash memory). It may store relevant characteristics of the driven MOSFET device, for example, the drain current Id as a function of the applied voltages (Vds, Vgs) and the temperature (Temp1) of the MOSFET device.

For that purpose, the digital drain to source voltage signal 105d may be mapped onto the x-axis (columns) of the look-up table 110 by the x-address decoder 111, while the gate to source voltage Vgs may be mapped on the y-axis (rows) of the look-up table 110 by the y-address decoder 112. Hence, an example for a digital device parameter 108 deduced by the look-up table 110 may comprise a digital word representing the drain current Id at a given temperature Temp1. Drain current values at different device temperatures may be mapped on different memory pages of the look-up table 110 by a page decoder 113.

Moreover, as shown in FIG. 2, the driver circuit 100 may comprise the DSP 130 as a processor. The DSP 130 may receive a number of digital parameters for further processing such as the deduced digital device parameter 108 from the look-up table 110, the current digital drain to source voltage signal 105*d* from the ADC 155, the current digital gate to source voltage signal 106*d* from the ADC 156 and may interchange further device information 121 with the memory 120. For instance, the DSP 130 may process the parameters that it receives to produce an adapted digital gate to source voltage signal 109*d*, i.e., the DSP 130 may generate a resulting driving signal.

This adapted digital gate to source voltage signal 109*d* may be provided to a digital-to-analog converter (DAC) to produce an adapted analog gate to source voltage signal 109*a*. The adapted analog gate to source voltage signal 109*a* may then in turn be provided to the power driver stage 140 to actually drive the corresponding MOSFET device to the adapted analog gate to source voltage signal 109*a*. The power driver stage 140 may generate the corresponding gate drive in form of an adapted and amplified analog gate to source voltage signal 106*a*. The driver circuit 100 may easily drive one ore more MOSFET devices. In case of driving a plurality of identical MOSFET devices, the look-up table 110 can be reused to provide the deduced digital device parameters 108 corresponding to the actual and possibly different terminal parameters of each of the further MOSFET devices.

Further regarding the DSP 130, it may be used to iteratively calculate the temperature Temp of the driven MOSFET device as a reliability relevant device parameter of the MOSFET switching device. This iterative calculation may be as follows.

For instance, at one point in time, the look-up table 110 may provide a start value for the drain current Id as deduced digital device parameter 108 to the DSP 130. The DSP 130 may then calculate a start value for a digital temperature parameter Temp 107 of the driven MOSFET device by multiplying the drain current Id as deduced digital device parameter 108 current with the digital drain to source voltage signal 105*d* as received from ADC 155 and a thermal impedance parameter Zth of the MOSFET device which may be accessed by the DSP 130 from the memory 120 (Temp=Ids*Vds*Zth).

The start value of the digital temperature parameter Temp 107 for a MOSFET device may then be provided to the page decoder 113 (e.g., as an n-bit word) to select the page of the look-up table 110 which corresponds to the start value of the digital temperature parameter Temp 107. Due this start value of the digital temperature parameter Temp 107 the look-up table 110 may provide an updated value for the drain current Id as updated deduced digital device parameter 108 to the DSP 130.

Correspondingly, the DSP 130 may then calculate an updated value for the digital temperature parameter Temp 107 of the driven MOSFET device. The updated value of the digital temperature parameter Temp 107 for the MOSFET device may then be provided to the page decoder 113 to select the page of the look-up table 110 which corresponds to the updated value of the digital temperature parameter Temp 107 and so on.

In the embodiment as shown in FIG. 2, the DSP 130 may perform several functions. It may further calculate other reliability relevant device parameters like power dissipation Pdiss in the driven MOSFET device by multiplying the drain current Id as deduced digital device parameter 108 with the corresponding digital drain to source voltage signal 105*d* (Pdiss=Id*Vds). The power dissipation the driven MOSFET device thus represents determined device information based on one terminal parameter, namely the drain to source voltage Vds of the MOSFET device, and one deduced device parameter, namely the drain current Id of the driven MOSFET device.

It may be necessary to iteratively calculate the power dissipation of the driven MOSFET device in a way corresponding to the above-described one since fluctuations of the drain to source voltage lead to fluctuations of the power dissipation which in turn lead to fluctuations of the temperature which in turn lead to fluctuations of the drain current which in turn lead to further fluctuations of the power dissipation and so on.

The DSP 130 may perform further iterative calculations to consider for example heating effects of the MOSFET device. Moreover, the DSP 130 may apply protection algorithms to avoid electrical overstress of the MOSFET device. If the calculated temperature or the calculated power dissipation in the MOSFET is too high, the DSP 130 may, e.g., prevent that the MOSFET device is further turned on due to a further increased amplified analog gate to source voltage signal 106*a*.

In this regard, the DSP 130 may calculate the safe gate to source voltage to switch the MOSFET device on or off, adapt the turn on/off times, the peak value or the slope—also in a nonlinear or non monotonic way. Moreover, the DSP 130 may apply de-rating factors that may be stored in the memory 120 after a predetermined number of overstress events have been registered. The memory 120 may be a general purpose memory. Optionally a non volatile memory may be used for the memory 120. In the memory 120 useful parameters may be stored, that are important for the reliability of the MOSFET devices, as well as device information about reliability related events within specific MOSFET devices. Some examples for this information may comprise the number of corresponding events and the value of predetermined device parameters during the events.

More specifically, examples for these events and device parameters during these events may comprise inductive clamping events which may reveal information related to the thermo-mechanical stress in the substrate of a MOSFET device, short circuit events of a MOSFET device, peak currents, clamping energy or power consumption of a MOSFET device for a predetermined time interval, i.e., the energy consumption of the corresponding MOSFET device. Hence, for each MOSFET device the history of device parameters and/or of device events may be tracked.

Predetermined ones or even all of the above parameters may be used by the DSP 130 to calculate de-rating factors and to read back the history of a MOSFET device which may be useful to determine a fatal accident rate (FAR) for the driven MOSFET device. Such de-rating factors may comprise lowering the excess current or temperature limits for the corresponding MOSFET device. Other device information which may be stored in the memory 120 could comprise the addresses of the MOSFET devices in case more than one MOSFET device is driven by the driver circuit 100. The driver circuit 100 may use these addresses for identifying each MOSFET device in an application with a plurality of MOSFET devices. Further, the memory 120 may store technical data such as thermal impedances of the device (and its package) or other information which may be needed to calculate the temperature of the device.

Embodiments which comprise a programmable memory may offer high flexibility by permitting the use of a large spectrum of MOSFET devices simply by downloading predetermined device parameters of the MOSFET device type into the memory of the driver according to an embodiment of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A driver for an electronic device, the driver comprising:
   at least one functional unit configured to be coupled to terminals of the electronic device, the at least one functional unit configured to:
   perform an electrical measurement of at least one of the terminals;
   determine a terminal parameter of the electrical device based on the electrical measurement;
   deduce a device parameter of the electronic device from the terminal parameter of the electronic device;
   calculate a temperature of the electronic device based on the device parameter and the terminal parameter; and
   generate a driving signal for the electronic device based on the deduced device parameter, wherein the driver is configured to drive at least one semiconductor switch.

2. The driver of claim 1, wherein the at least one functional unit is configured to generate the driving signal for the electronic device based on the deduced device parameter for protecting the electronic device.

3. The driver of claim 1, wherein the at least one functional unit is configured to process the terminal parameter of the electronic device to calculate at least one device parameter.

4. The driver of claim 1, wherein the at least one semiconductor switch comprises a Metal-Oxide Semiconductor Field Effect Transistor (MOSFET) switch, a bipolar transistor switch, or an Insulated Gate Bipolar Transistor (IGBT) switch.

5. A driver circuit for at least one switching device, the driver circuit comprising:
   an input circuit configured to be coupled to a terminal of the at least one switching device, the input circuit configured to measure an electrical parameter of the at least one switching device and determine at least one terminal parameter of the at least one switching device;
   a driving circuit configured to be coupled to a control terminal of the at least one switching device, the driving circuit configured to output a driving signal to the control terminal of the at least one switching device; and
   a computation circuit configured to determine at least one device parameter of the at least one switching device as determined device information for adapting the driving signal for the at least one switching device and determine a temperature of the at least one switching device based on the at least one terminal parameter.

6. The driver circuit of claim 5, wherein the computation circuit comprises a look-up table to deduce at least one deduced device parameter of the switching device as the determined device information in dependence of at least one terminal parameter.

7. The driver circuit of claim 6, further comprising a processor to calculate at least one reliability relevant device parameter of the switching device as the determined device information based on at least one terminal parameter and/or at least one deduced device parameter.

8. The driver circuit of claim 7, wherein the at least one reliability relevant device parameter of the switching device comprises one or more of instant power dissipation, a predetermined instant temperature, current or voltage, a moving peak power dissipation, and/or a predetermined moving peak temperature, current or voltage.

9. The driver circuit of claim 7, wherein the processor is further configured to monitor and/or count at least one reliability relevant event of the switching device as the determined device information.

10. The driver circuit of claim 9, wherein the at least one reliability relevant event of the switching device comprises at least one of a short circuit event, an excess temperature operation event, an excess current operation event, an excess voltage operation event, and/or an inductive clamping events.

11. The driver circuit of claim 7, wherein the processor further implements a protection algorithm to generate the driving signal suited to protect the at least one switching device, wherein the protection algorithm is comprises an algorithm for generation and consideration of de-rating factors for the at least one switching device and/or monitoring of a safe operation area (SOA) of the switching device.

12. The driver circuit of claim 7, wherein the processor is further configured to monitor that at least one piece of determined device information is inside a safe device operating area (SOA) which is stored in a storage unit.

13. The driver circuit of claim 5, further comprising a memory to store at least one piece of determined device information and/or device characteristic information.

14. A system comprising:
    the driver circuit of claim 5; and
    a switching device, wherein the driver circuit and the switching device are monolithically integrated and fabricated in a smart power semiconductor technology with an embedded state machine or microprocessor.

15. A method for driving at least one device, the method comprising:
    performing an electrical measurement on a terminal of the at least one device;
    determining at least one terminal parameter of the at least one device based on the electrical measurement;
    deducing at least one device parameter of the at least one device from the at least one terminal parameter;
    calculating a temperature of the at least one device based on the at least one device parameter and the at least one terminal parameter; and
    generating at least one driving signal for the at least one device in dependence of the at least one terminal parameter, the at least one device comprising a semiconductor switch.

16. The method of claim 15, further comprising calculating at least one reliability relevant device parameter based on the at least one terminal parameter.

17. The method of claim 16, further comprising monitoring at least one reliability relevant event of the at least one device.

18. The method of claim 17, further comprising tracking a number of at least one specific reliability relevant event and/or at least one reliability relevant device parameter during the at least one specific reliability relevant event.

19. The method of claim 15, further comprising performing a protection algorithm for generating the at least one driving signal, wherein the protection algorithm comprises generation and consideration of de-rating factors for the at least one device and/or monitoring of a safe operation area (SOA) of the at least one device.

20. A system for controlling a switching transistor, the system comprising:

a driver circuit configured to be couple to a control terminal of the switching transistor;

a first input circuit configured to be coupled to the control terminal of the switching transistor;

a second input circuit configured to be coupled to an output terminal of the switching transistor; and a computation circuit coupled to the driver circuit, the first input circuit, and the second input circuit, the computation circuit configured to determine device parameters of the switching transistor based on input from the first and second input circuits, determine a temperature of the switching transistor based on the determined device parameters, and control the driver circuit according to the determined device parameters.

21. The system of claim 20, wherein:

the first input circuit comprises a first analog-to-digital (A/D) converter;

the second input circuit comprises a second A/D converter; and the computation circuit comprises a lookup table having inputs coupled to outputs of the first and second input circuits, and a digital-to-analog converter coupled to an output of the lookup table and an input of the driver circuit.

22. The system of claim 21, wherein the computation circuit comprises a lookup table.

23. The system of claim 22, wherein the lookup table is configure to output a current value of the switching transistor based on the outputs of the first and second input circuits.

24. The system of claim 23, wherein the computation circuit further comprises a DSP circuit configured to calculate the temperature of the switching transistor based on the outputs of the first and second input circuits and the output of the lookup table; and a lookup table is configured to output a current value of the switching transistor based on the outputs of the first and second input circuits and the calculated temperature.

\* \* \* \* \*